(12) United States Patent
Jenkins et al.

(10) Patent No.: US 10,881,037 B2
(45) Date of Patent: Dec. 29, 2020

(54) METAL ADDITIVE STRUCTURES ON PRINTED CIRCUIT BOARDS

(71) Applicant: Microsoft Technology Licensing, LLC, Redmond, WA (US)

(72) Inventors: Kurt Allen Jenkins, Sammamish, WA (US); Gary Russell McClary, Palisade, CO (US); Lincoln Matthew Ghioni, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 13 days.

(21) Appl. No.: 16/386,947

(22) Filed: Apr. 17, 2019

(65) Prior Publication Data

US 2019/0254200 A1  Aug. 15, 2019

Related U.S. Application Data

(63) Continuation of application No. 15/392,934, filed on Dec. 28, 2016, now abandoned.

(51) Int. Cl.
*H05K 9/00* (2006.01)
*H05K 1/02* (2006.01)
(Continued)

(52) U.S. Cl.
CPC ............ *H05K 9/0032* (2013.01); *B33Y 80/00* (2014.12); *H01L 23/552* (2013.01);
(Continued)

(58) Field of Classification Search
CPC . H01L 23/00; H01L 23/5382; H01L 23/5389; H01L 23/552; H01L 2224/32225;
(Continued)

(56) References Cited

U.S. PATENT DOCUMENTS 3,721,746 A    3/1973   Knappenberger
5,014,160 A    5/1991   McCoy, Jr.
(Continued)

FOREIGN PATENT DOCUMENTS

DE    102014203309 A1    8/2015
DE    102014113990 A1    3/2016
(Continued)

OTHER PUBLICATIONS

"3D Printed Electronics: Aerosol Jet Technology", Retrieved on: Aug. 4, 2016 Available at: http://www.optomec.com/printed-electronics/aerosol-jet-technology/.
(Continued)

*Primary Examiner* — Carl J Arbes
(74) *Attorney, Agent, or Firm* — Holzer Patel Drennan (57) ABSTRACT

Printed circuit boards include conductive metallic paths, such as vias, traces, and pads on the printed circuit board. One or more metal additive structures are additively manufactured onto the printed circuit boards in a manner that forms a continuous weld with at least one of the conductive metallic paths. As a result, the metal additive structures are continuous with the printed circuit board and do not require separate attachment mechanisms (e.g., soldering or mechanical fastening). The metal additive structures may include shield cans, frames, antennas, or heat sinks for the printed circuit board, for example.

19 Claims, 5 Drawing Sheets

(51) Int. Cl.
  *H05K 1/11* (2006.01)
  *H05K 1/18* (2006.01)
  *H05K 3/10* (2006.01)
  *H01L 23/552* (2006.01)
  *H05K 1/16* (2006.01)
  *B33Y 80/00* (2015.01)
  *B33Y 10/00* (2015.01)
  *B29C 64/10* (2017.01)

(52) U.S. Cl.
  CPC ......... *H05K 1/0203* (2013.01); *H05K 1/0218* (2013.01); *H05K 1/111* (2013.01); *H05K 1/115* (2013.01); *H05K 1/16* (2013.01); *H05K 1/181* (2013.01); *H05K 3/10* (2013.01); *H05K 9/0024* (2013.01); *B29C 64/10* (2017.08); *B33Y 10/00* (2014.12); *H01L 2224/16227* (2013.01); *H01L 2224/32225* (2013.01); *H01L 2224/81815* (2013.01); *H01L 2224/83815* (2013.01); *H01L 2924/14* (2013.01); *H01L 2924/15192* (2013.01); *H01L 2924/19041* (2013.01); *H01L 2924/19043* (2013.01); *H01L 2924/19105* (2013.01); *H01L 2924/3025* (2013.01); *H05K 1/0206* (2013.01); *H05K 2201/10098* (2013.01); *H05K 2201/10128* (2013.01); *H05K 2201/10371* (2013.01); *H05K 2201/2018* (2013.01); *H05K 2203/107* (2013.01)

(58) Field of Classification Search
  CPC . H01L 2224/81815; H01L 2224/83815; H01L 2924/14; H01L 2924/15192; H01L 2924/16227; H01L 2924/19041; H01L 2924/18943; H01L 2924/19105; H01L 2924/3025; H05K 7/20; H05K 7/20154; H05K 9/00; H05K 1/0203; H05K 1/0206; H05K 1/0218; H05K 1/111; H05K 1/115; H05K 1/16; H05K 1/181; H05K 3/10; H05K 9/0024; H05K 9/0032; H05K 2201/10098; H05K 2201/10128; H05K 2201/10371; H05K 2201/2018; H05K 2003/107; B29C 64/10; B33Y 10/00; B33Y 80/00
  See application file for complete search history.

(56) References Cited

U.S. PATENT DOCUMENTS

| | | | | |
|---|---|---|---|---|
| 5,160,807 A | * | 11/1992 | Fry | H05K 9/0033 174/372 |
| 5,717,577 A | * | 2/1998 | Mendolia | H05K 9/0028 361/818 |
| 5,940,272 A | | 8/1999 | Emori et al. | |
| 6,043,992 A | | 3/2000 | Scheibler | |
| 6,075,700 A | * | 6/2000 | Houghton | H01L 23/3675 165/80.2 |
| 6,822,609 B2 | | 11/2004 | Mendolia et al. | |
| 6,943,436 B2 | * | 9/2005 | Radu | H01L 23/552 257/659 |
| 7,085,142 B2 | * | 8/2006 | Berberich | H05K 9/0028 361/818 |
| 7,186,924 B2 | * | 3/2007 | Geva | H05K 1/0219 174/255 |
| 7,707,716 B2 | | 5/2010 | Song et al. | |
| 8,004,860 B2 | | 8/2011 | Salzman | |
| 2003/0080836 A1 | | 5/2003 | Nagaishi et al. | |
| 2003/0107881 A1 | | 6/2003 | Muramatsu et al. | |
| 2004/0027819 A1 | | 2/2004 | Berberich | |
| 2004/0240191 A1 | | 12/2004 | Arnold et al. | |
| 2011/0255850 A1 | | 10/2011 | Dinh et al. | |
| 2013/0170171 A1 | | 7/2013 | Wicker et al. | |
| 2014/0111949 A1 | | 4/2014 | Gao | |
| 2014/0268604 A1 | | 9/2014 | Wicker et al. | |
| 2015/0201500 A1 | | 7/2015 | Shinar et al. | |
| 2015/0270089 A1 | | 9/2015 | Ghanea-Hercock | |
| 2015/0289413 A1 | | 10/2015 | Rush et al. | |
| 2016/0086376 A1 | | 3/2016 | Tang et al. | |
| 2016/0293554 A1 | | 10/2016 | Tan et al. | |

FOREIGN PATENT DOCUMENTS

| | | |
|---|---|---|
| EP | 2131640 A1 | 12/2009 |
| WO | 2016036854 A1 | 3/2016 |

OTHER PUBLICATIONS

Thilmany, Jean, "3D Printing Electronics: A Faster, More Flexible World of Manufacturing Circuitry—Even in a Dress", Published on: May 21, 2015 Available at: https://lineshapespace.com/3d-printing-electronics-faster-more-flexible-manufacturing-circuitry/.

MIKEY77, "3D Printing: 3D Print a Solderless Circuit Board", Retrieved on: Aug. 4, 2016 Available at: http://www.instructables.com/id/3D-Printing-3D-Print-A-Solderless-Circuit-Board/.

Deffenbaugh, et al., "Fully 3D Printed 2.4 GHz Bluetooth/Wi-Fi Antenna", In Proceedings of International Symposium on Microelectronics, International Microelectronics Assembly and Packaging Society, Jan. 2013, pp. 1-7.

Werkheiser, Niki, "Overview of NASA Initiatives in 3D Printing and Additive Manufacturing", In Proceedings of DoD Maintenance Symposium, Nov. 17, 2014, pp. 1-28.

"International Search Report and Written Opinion Issued in PCT Patent Application No. PCT/US2017/066550", dated Jun. 6, 2018, 17 Pages.

https://en.wikipedia.org/wiki/Fusion_welding, Oct. 3, 2018.

* cited by examiner

FIG. 1A

Section A-A

Section B-B

Section C-C

Section D-D

METAL ADDITIVE STRUCTURES ON PRINTED CIRCUIT BOARDS

CROSS-REFERENCE TO RELATED APPLICATIONS

The present application is a continuation of U.S. patent application Ser. No. 15/392,934 entitled "Metal Additive Structures on Printed Circuit Boards" and filed on Dec. 28, 2016, which is specifically incorporated by reference herein for all that it discloses.

BACKGROUND

A printed circuit board (PCB) mechanically supports and electrically interconnects an array of electronic components using conductive traces, vias, and other features etched from metallic sheets laminated onto a non-conductive substrate. Typically, the electronic components are soldered to the conductive features of the PCB.

As packaging requirements for PCBs become tighter, particularly for mobile devices where space is at a premium, soldered connections are less desirable as they take significant space to yield a sufficiently strong connection. Further, tighter packaging requirements often place the electronic components physically closer together on a PCB, which leads to difficulties in effective heat transfer away from the PCB. Tighter packaging may also lead to difficulties shielding sensitive electronic components on the PCB from other electronic components that may generate electromagnetic interference, or vice versa.

One solution is encompassing the sensitive electronic components within one or more shield cans (e.g., a physical enclosure operated as a faraday cage) soldered to the PCB. However, the soldered shield cans require a significant flange for the soldered connection with the PCB and must have sufficient thickness to span the sensitive electronic components within the shield can using a perimeter support only.

Mechanisms to reduce the footprint of shield cans, increase conductivity between the PCB and an available heat sink, and effectively create intricate structures onto the PCB would be helpful to maximize usage of PCB space and minimize overall PCB size.

SUMMARY

The described technology provides a printed circuit board including an insulating substrate with one or more conductive metallic paths thereon. A layered metallic structure is additively manufactured onto and is continuous with the conductive metallic paths and extending away from the printed circuit board.

The described technology further provides a method of manufacturing a printed circuit board including forming one or more conductive metallic paths on an insulating substrate. The method further including additively manufacturing a series of layers of a metallic structure onto and continuous with the conductive metallic paths and extending away from the printed circuit board.

Other implementations are also described and recited herein.

DETAILED DESCRIPTIONS

Figure 1A:
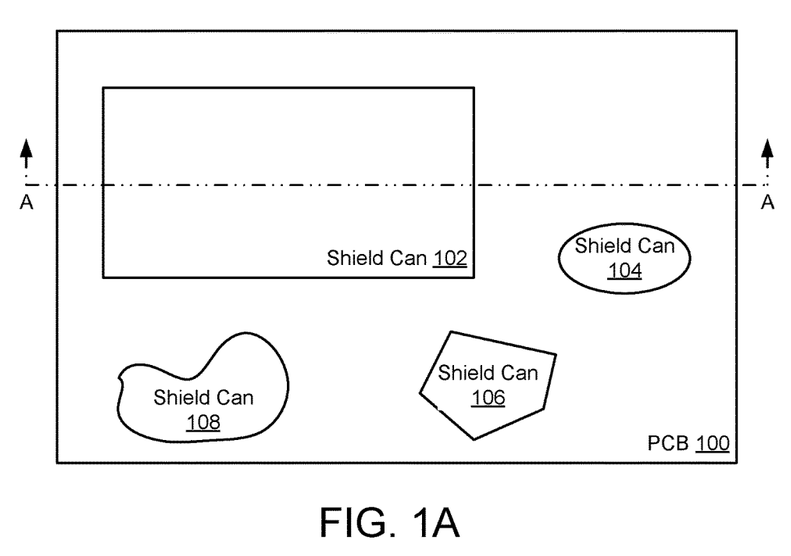
FIG. 1A illustrates a plan view of an example printed circuit board incorporating several metal additive shield cans.

FIG. 1A illustrates a plan view of an example printed circuit board (PCB) 100 incorporating several metal additive shield cans 102, 104, 106, 108. The shield cans 102, 104, 106, 108 may each encompass one or more electronic components that are sensitive to electronic interference generated by nearby electronic components on the PCB 100 or other nearby electronic devices. The shield cans 102, 104, 106, 108 may be operated as faraday cages to shield the electronic components therein from external electric fields (e.g., radio frequency and electromagnetic interference). In other implementations, the shield cans 102, 104, 106, 108 are operated as faraday cages to shield external electronic components from electric fields generated by the electronic components therein. The shield cans 102, 104, 106, 108 may take any convenient shape to accommodate the electronic components contained therein. For example, shield can 102 is rectangular, shield can 104 is oval, shield can 106 is multi-faceted, and shield can 108 has a complex curved closed profile.

Figure 1B:
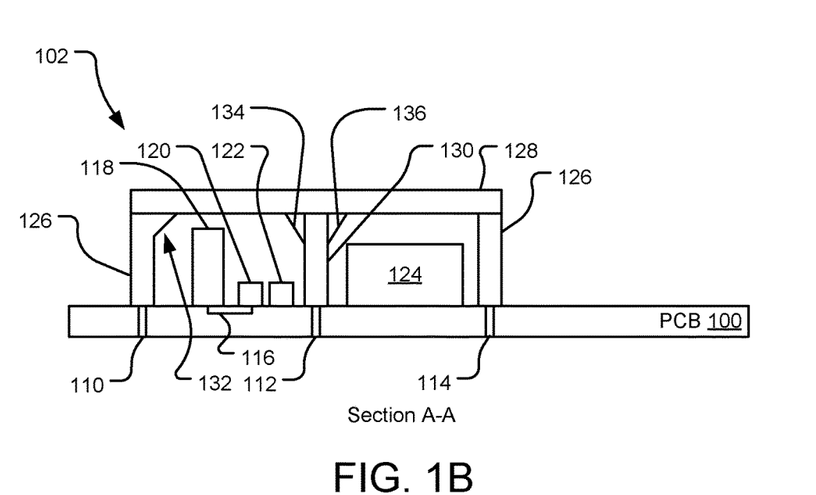
FIG. 1B illustrates section A-A of the example printed circuit board of FIG. 1A.

FIG. 1B illustrates section A-A of the example PCB 100 of FIG. 1A. The PCB 100 is a primary insulating substrate (e.g., a woven fiberglass cloth with an epoxy resin binder) with a network of conductive vias (e.g., vias 110, 112, 114), traces (e.g., trace 116) and other conductive paths or areas thereon. The PCB 100 further includes a variety of electronic components (e.g., electronic components 118, 120, 122, 124) soldered to the network of conductive paths to create a functional electrical network interconnecting the electronic components. In various implementations, the electronic components 118, 120, 122, 124 or other electronic components (not shown) may include capacitors, resistors, microprocessors, storage devices, etc. The PCB 100 may be single-sided (e.g., having one conductive layer, as shown in FIG. 1B), double-sided (e.g., having two conductive layers) or multi-layer (e.g., having outer and inner conductive layers). Various implementations described herein may be implemented on single-sided, double-sided, or multi-layer PCBs.

Conductive paths on different layers of the PCB 100 may be connected with vias. In various implementations, a far greater number and complexity of conductive traces, vias, and other paths, as well as electronic components, are included in the PCB 100 as compared to that shown in FIGS. 1A and 1B. Further, printed circuit boards as referred to herein are defined as any insulating substrate with a network of conductive paths formed thereon or therein. In various implementations, the PCB 100 substrate may include ceramics, fiberglass, plastics (e.g., flexible polymers), or any combination thereof. In one example implementation, the PCB 100 is a flexible printed circuit ("FPC") on a polyimide substrate.

A shield can wall 126 is additively manufactured onto and continuous with the conductive paths or areas on the PCB 100 (e.g., vias 110, 114, as illustrated in FIG. 1B) in a manner that incrementally surrounds the electronic components 118, 120, 122, 124 and forms a perimeter around the electronic components 118, 120, 122, 124. Various additive manufacturing processes may be used to build the shield can wall 126 (e.g., powder bed fusion, selective laser melting, direct metal laser sintering, directed energy deposition, electron beam melting, particle jetting, and metal screen printing). Construction of the shield can wall 126 via powder bed fusion is described in detail below with reference to FIG. 5.

A shield can lid 128 is attached to a top of the finished shield can wall 126 to fully encompass the electronic components 118, 120, 122, 124 within the shield can 102. The shield can lid 128 is a thin piece of material (e.g., sheet metal) that may be interference fit, soldered, adhered, and/or mechanically fastened to the shield can wall 126.

One or more internal supports (e.g., internal support 130) may also be additively manufactured onto and continuous with the conductive paths or areas on the PCB 100 (e.g., via 112, as illustrated in FIG. 1B). The internal support 130 provides additional structural support for the shield can lid 128, which enables the shield can lid 128 to be thinner than otherwise possible due to a reduced span distance between outer extents of the shield can wall 126. In various implementations, the internal support 130 may instead be a pogo pin, a leaf spring, or a finger connector.

Further, the shield can wall 126 and/or internal support 130 may include one or more attachment features 132, 134, 136 that provide additional contact area with the shield can lid 128. Attachment feature 132 is an area of increased thickness of the shield can wall 126 at an interface with the shield can lid 128. The attachment feature 132 may be additively manufactured continuously with the shield can wall 126 to provide an improved connection with the shield can lid 128. Attachment features 134, 136 are thin extensions from the internal support 130 that form a truss-like structure when attached to the shield can lid 128. The attachment features 134, 136 may be additively manufactured continuously with the internal support 130 to provide an improved connection with and stronger structure in combination with the shield can lid 128. The physical arrangement of the attachment features 132, 134, 136 is provided as an example only, other physical arrangements of the attachment features are contemplated herein.

As compared to conventional shield cans that are soldered to a PCB, the shield can 102 lacks a mounting flange at its interface with the PCB 100, which reduces the required footprint of the shield can 102. Soldered connections typically require a larger surface area for effective bonding. For example, border width of a conventional shield can may be approximately 1.5 mm, which is reduced to approximately 0.15 mm in shield can 102 (or reduced by a factor of 10). Further, the shield can 102 may have any convenient shape to encompass the electronic components 118, 120, 122, 124 (see e.g., shield cans 102, 104, 106, 108), whereas conventional soldered shield cans are typically limited to rectangular shapes. Still further, conventional soldered shield cans lack the internal supports and attachment features disclosed herein. As a result, conventional soldered shield cans are typically thicker to support larger spans without additional structural support.

While the shield can wall 126 has a generally rectangular plan (as illustrated in FIG. 1A) and a generally rectangular cross-section (as illustrated in FIG. 1B), the shield can wall 126 and other additively manufactured features of the PCB 100 may have any desired shape to achieve desired performance characteristics. Further, the shield can 102 may include lattice, honeycomb, or other complex structures, and may be porous. In some implementations, these complex structures achieve a desired structural rigidity, while saving weight and material within the shield can 102.

The conductive trace 116 and vias 110, 112, 114, shield can wall 126, and shield can lid 128 may be made of the same or different complementary metallic materials. For example, each of the conductive trace 116 and vias 110, 112, 114, shield can wall 126, and shield can lid 128 may be made of steel, stainless steel, nickel, copper, other metals, and various alloys thereof. In one example implementation, while the conductive trace 116 and vias 110, 112, 114 are made of a copper alloy, the shield can wall 126 and the shield can lid 128 are made of steel. Further, the conductive trace 116 and vias 110, 112, 114, shield can wall 126, and/or shield can lid 128 may be plated with an additional material over an underlying base metal. The plating may aid in the additively manufacturing process and may help control corrosion of the conductive trace 116 and vias 110, 112, 114, shield can wall 126, and/or shield can lid 128.

Figure 2A:
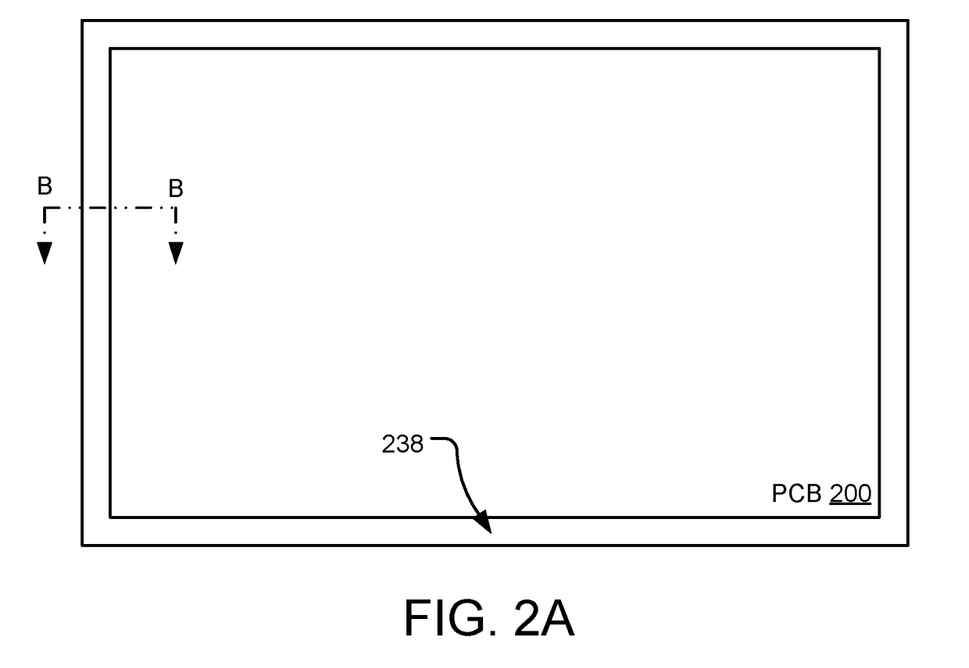
FIG. 2A illustrates a plan view of an example printed circuit board incorporating a metal additive frame.

FIG. 2A illustrates a plan view of an example printed circuit board 200 incorporating a metal additive frame 238. The metal additive frame 238 is additively manufactured onto and continuous with one or more conductive paths or areas on the PCB 200. The metal additive frame 238 may be used to attach additional components to the PCB 200 forming an electronic device (not shown). Further, the PCB 200 may form part of the structure of the electronic device in combination with the frame 238.

Figure 2B:
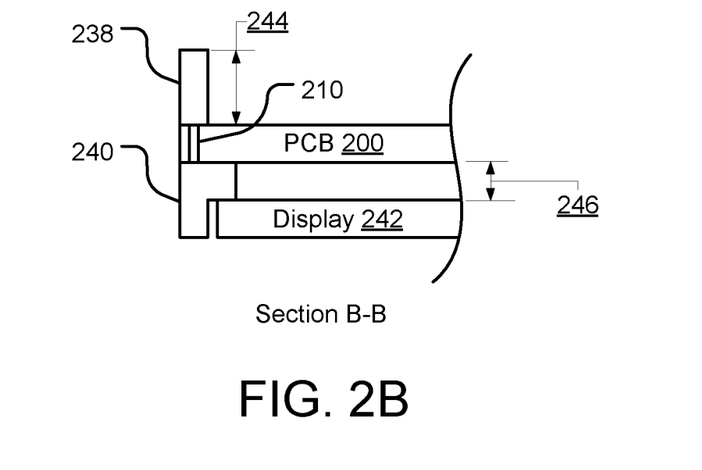
FIG. 2B illustrates section B-B of the example printed circuit board of FIG. 2A.

FIG. 2B illustrates section B-B of the example printed circuit board 200 of FIG. 2A. The PCB 200 is an insulating substrate including a network of conductive vias, traces, and other conductive paths or areas, as well as a variety of electronic components, as described in detail above with reference to FIGS. 1A and 1B.

The frame 238 is additively manufactured onto and continuous with conductive paths or areas on the PCB 200 (e.g., via 210 as illustrated in FIG. 2B) in a manner that incrementally created the frame 238 extending a predetermined distance 244 from the PCB 200. Additional electrical, mechanical, structural, or other components of a corresponding electronic device (not shown) may then be attached to the frame 238. In various implementations, the frame 238 may also act as a ground bus bar, USB or audio connector, or other electrical feature built integrally with the PCB 200.

A second frame 240 is also additively manufactured onto and continuous with the via 210 (as well as other conductive paths or areas), as illustrated in FIG. 1B, in a manner that incrementally creates the second frame 240 creating a stepped offset 246 from the PCB 200 in a direction from the PCB 200 opposite the frame 238. The stepped shape of the second frame 240 creates a seat for a display 242 (e.g., a liquid crystal display (LCD), a plasma display, an electroluminescent display (ELD), and an organic light-emitting diode (OLED) display) to be attached to the second frame 240, which allows the display 242 to be tied structurally to the PCB 200, while maintaining a precise and potentially small offset distance from the PCB 200 (e.g., about 0.4 mm). In various implementations, one or both of the frames 238, 240 may take the form of a compliant gasket.

In some implementations, the via 210 includes or is merely a hole in the PCB 200 and the frames 238, 240 are created continuously through the hole 210 in the additive manufacturing process. Various additive manufacturing processes may be used to build the frame 238 and the second frame 240. The display 242 is soldered, adhesively attached, and/or mechanically fastened to second frame 240. Other electrical, mechanical, structural, or other components of the corresponding device may be similarly attached to the frame 238 or the second frame 240.

One or more internal supports (not shown, see e.g., internal support 130 of FIG. 1B) may also be additively manufactured onto and continuous with the conductive paths or areas on the PCB 200. The internal supports provide additional structural support for the display 242 or other components attached to the frame 238 or the second frame 240.

Further, the frame 238, the second frame 240, and/or the internal supports may include one or more attachment features (not shown, see e.g., attachment features 132, 134, 136 of FIG. 1B) that provide additional contact area with the display 242 or other components attached to the frame 238 or the second frame 240 and/or the internal supports. The attachment features may be additively manufactured continuously with the frame 238, the second frame 240, and/or the internal supports to provide an improved connection with and stronger structure in combination with the display 242 or other components attached to the frame 238 or the second frame 240.

While the frame 238 and the second frame 240 have a generally rectangular plan (as illustrated in FIG. 2A) and a generally rectangular cross-section (as illustrated in FIG. 2B), the frame 238, the second frame 240, and other additively manufactured features of the PCB 200 may have any desired shape to achieve desired performance characteristics. Still further, the frame 238 and the second frame 240 may include lattice, honeycomb, or other complex structures, and may be porous. The conductive via 210, other conductive paths or areas on the PCB 200, the frame 238, and the second frame 240 may each be made of the same or different complementary metallic materials, as discussed in detail above with reference to FIGS. 1A and 1B.

Figure 3A:
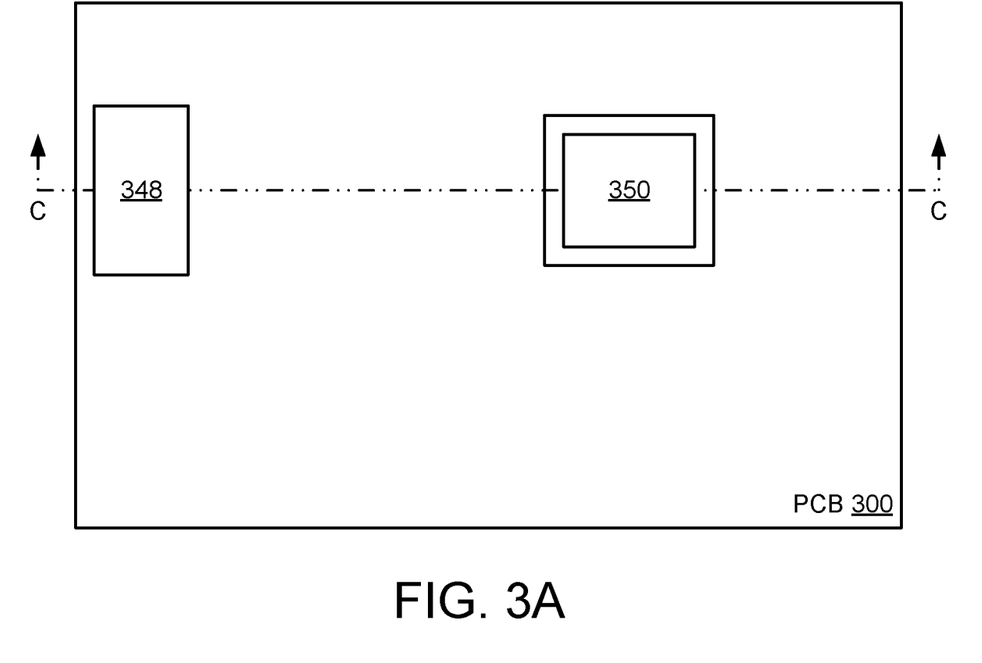
FIG. 3A illustrates a plan view of an example printed circuit board incorporating metal additive antennas.

FIG. 3A illustrates a plan view of an example printed circuit board 300 incorporating metal additive antennas 348, 350. The metal additive antennas 348, 350 are conductive structures that convert electricity into electromagnetic waves, and vice versa. The metal additive antennas 348, 350 may take a variety of forms (e.g., dipole, monopole, array, loop, aperture, and traveling wave) and be of a variety of types (e.g., patch, microstrip, planar, inverted-L, inverted-F, planar inverted-F, and folded inverted conformal). Other antenna forms and types are contemplated herein. The metal additive antennas 348, 350 are additively manufactured onto and continuous with one or more conductive paths or areas on the PCB 300.

Figure 3B:
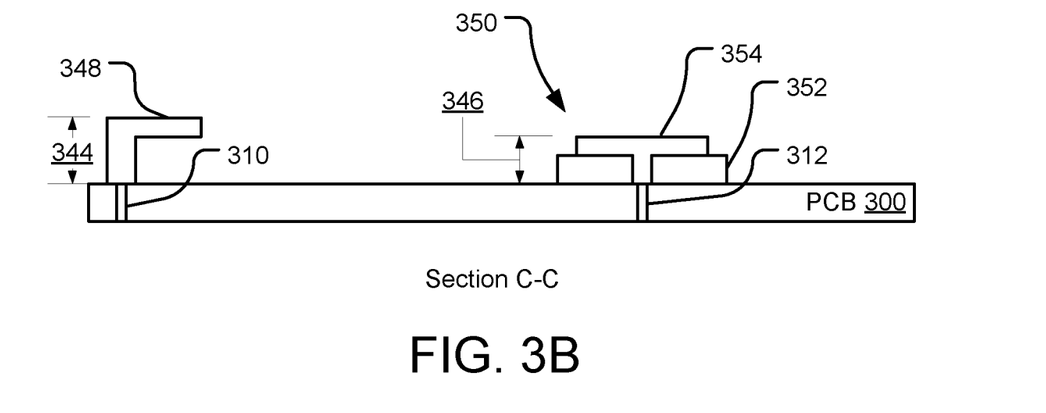
FIG. 3B illustrates section C-C of the example printed circuit board of FIG. 3A.

FIG. 3B illustrates section C-C of the example printed circuit board 300 of FIG. 3A. The PCB 300 is an insulating substrate including a network of conductive vias, traces, and other conductive paths or areas, as well as a variety of electronic components, as described in detail above with reference to FIGS. 1A and 1B.

The antenna 348 is additively manufactured onto and continuous with conductive paths or areas on the PCB 300 (e.g., via 310 as illustrated in FIG. 3B) in a manner that incrementally creates the antenna 348 extending a predetermined distance 344 from the PCB 300. While the antenna 348 is depicted as an inverted-L design, other antennae designs are contemplated herein.

The antenna 350 is also additively manufactured onto and continuous with conductive paths or areas on the PCB 300 (e.g., via 312 as illustrated in FIG. 3B) in a manner that incrementally creates the antenna 350 extending a predetermined distance 346 from the PCB 300. Antenna 350 is depicted as a patch antenna (or rectangular microstrip antenna), which is a low-profile rectangular antenna that is mounted on a flat surface (e.g., the PCB 300) While the antenna 350 is depicted as a two-part patch antenna, with a dielectric portion 352 (e.g., a polymer or ceramic) and a patch conductor 354, other antennae designs are contemplated herein.

Conventionally, antennas are soldered onto the PCB 300 and have limited options for fine tuning impedance. The disclosed additively manufactured antennas 348, 350 can be constructed to match the corresponding RF circuit impedance (e.g., 50 ohms), which can yield improvements in antenna performance. More specifically, the antenna design can be impedance-matched with the corresponding conductive paths or areas of the PCB 300. The disclosed additively manufactured antennas 348, 350 may also be incorporated as part of the structure of a corresponding electronic device.

Various additive manufacturing processes may be used to build the antennas 348, 350. While the antennas 348, 350 have a generally rectangular plan (as illustrated in FIG. 3A) and specific cross-sections (as illustrated in FIG. 3B), the antennas 348, 350 may have any desired shape to achieve desired performance characteristics. Still further, the antennas 348, 350 may include lattice, honeycomb, or other complex structures, and may be porous. The vias 310, 312, other conductive paths or areas on the PCB 300, and the antennas 348, 350 may each be made of the same or different complementary metallic materials, as discussed in detail above with reference to FIGS. 1A and 1B.

Figure 4A:
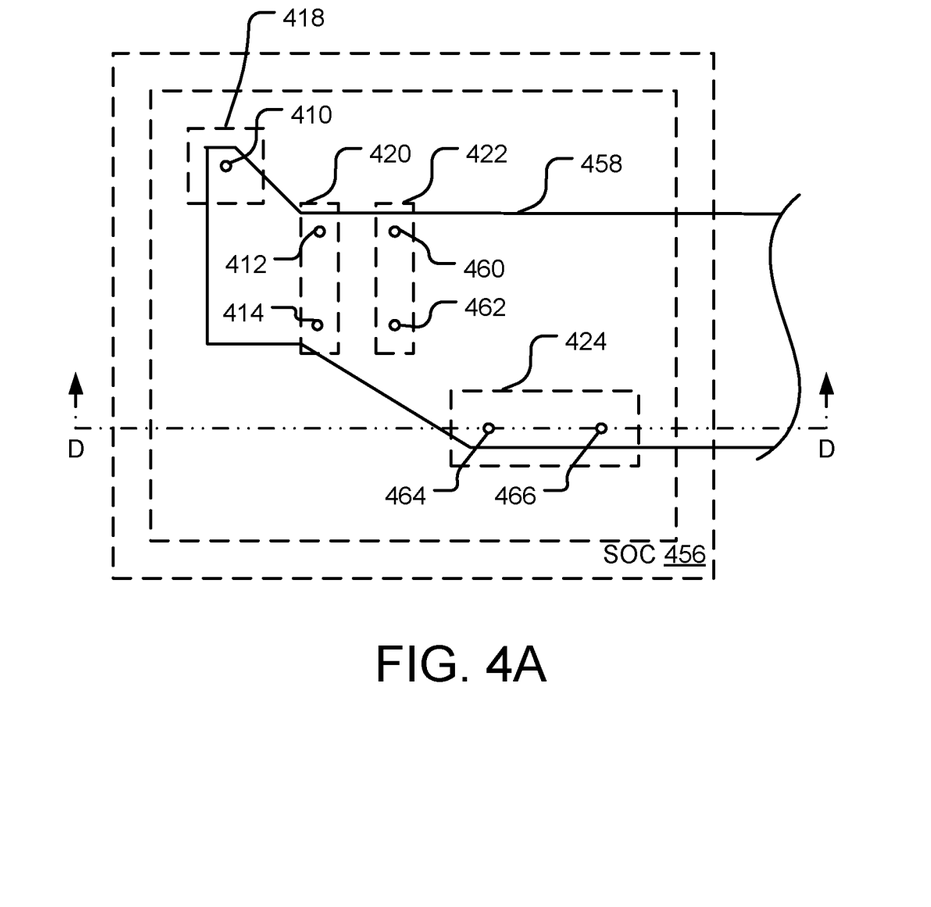
FIG. 4A illustrates a plan view of an example system on chip package incorporating a metal additive heat sink.

FIG. 4A illustrates a plan view of an example system on chip (SOC) 456 package incorporating a metal additive heat sink 458. The SOC 456 is an integrated circuit that includes an array of electronic components (e.g., electronic components 418, 420, 422, 424) communicatively coupled to perform computing operations in unison (e.g., operate as a computer). The metal additive heat sink 458 is additively manufactured onto and continuous with one or more thermally conductive paths or areas (e.g., vias 410, 412, 414, 460, 462, 464, 466) from the electronic components through a PCB (not shown, see PCB 400 of FIG. 4B). The metal additive heat sink 458 conducts thermal energy away from the electronic components and out of the SOC 456. The metal additive heat sink 458 may take any convenient shape to effectively conduct thermal energy away from the SOC 456 and/or other electronic components. Still further, the heat sink 458 may include lattice, honeycomb, or other complex structures, and may be porous.

Figure 4B:
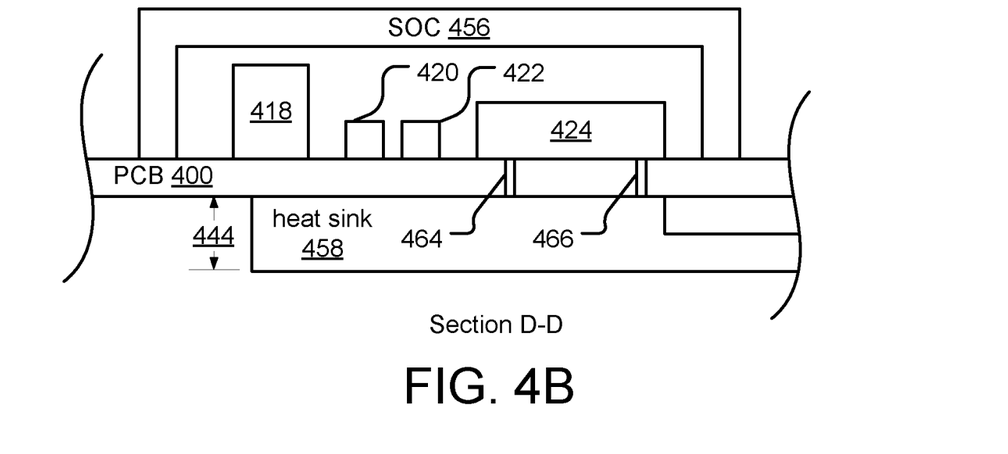
FIG. 4B illustrates section D-D of the example system on chip package of FIG. 4A.

The SOC 456 and electronic components 418, 420, 422, 424 are illustrated transparently (dashed lines) and the PCB is not illustrated at all in FIG. 4A in order to show the relative placement of the vias 410, 412, 414, 460, 462, 464, 466 and metal additive heat sink 458 in FIG. 4B.

FIG. 4B illustrates section D-D of the example SOC 456 of FIG. 4A. The SOC 456 is mounted on PCB 400. The PCB 400 is an insulating substrate including a network of conductive vias, traces, and other conductive paths or areas, as well as a variety of electronic components, as described in detail above with reference to FIGS. 1A and 1B.

The heat sink 458 is additively manufactured onto and continuous with conductive paths or areas on the PCB 400

(e.g., vias 464, 466, as illustrated in FIG. 4B) in a manner that incrementally created the heat sink 458 extending a predetermined distance 444 from the PCB 400 on a side of the PCB 400 opposite the SOC 456. Thermal energy primarily travels from the electronic components 418, 420, 422, 424 within the SOC 456, through the vias 410, 412, 414, 460, 462, 464, 466, into the heat sink 458, and away from the SOC 456. As compared to conventional SOC thermal management solutions, no thermal interface material is required between the PCB 400 and the heat sink 458 to achieve a high thermal transfer coefficient. Some conventional thermal interface materials achieve 2-8 W/mK (watts per meter Kelvin), while the presently disclosed heat sinks (e.g., heat sink 458) may achieve 100-200 W/mK.

While the heat sink 458 is depicted as a solid conductor extending away from the SOC 456, the heat sink 458 may take other forms (e.g., a heat pipe, a vapor chamber, and a heat spreader). Other heat sink designs are contemplated herein. Various additive manufacturing processes may be used to build the heat sink 458. Further, the vias 410, 412, 414, 460, 462, 464, 466, other conductive paths or areas on the PCB 400, and the heat sink 458 may each be made of the same or different complementary metallic materials, as discussed in detail above with reference to FIGS. 1A and 1B. While the metal additive heat sink 458 is illustrated as specifically conducting thermal energy away from the SOC 456, the metal additive heat sink 458 could be used to conduct thermal energy away from any electronic component mounted on the PCB 400, or the PCB 400 itself. Further, the heat sink 458 may also be incorporated as part of the structure of an overall electronic device.

Figure 5:
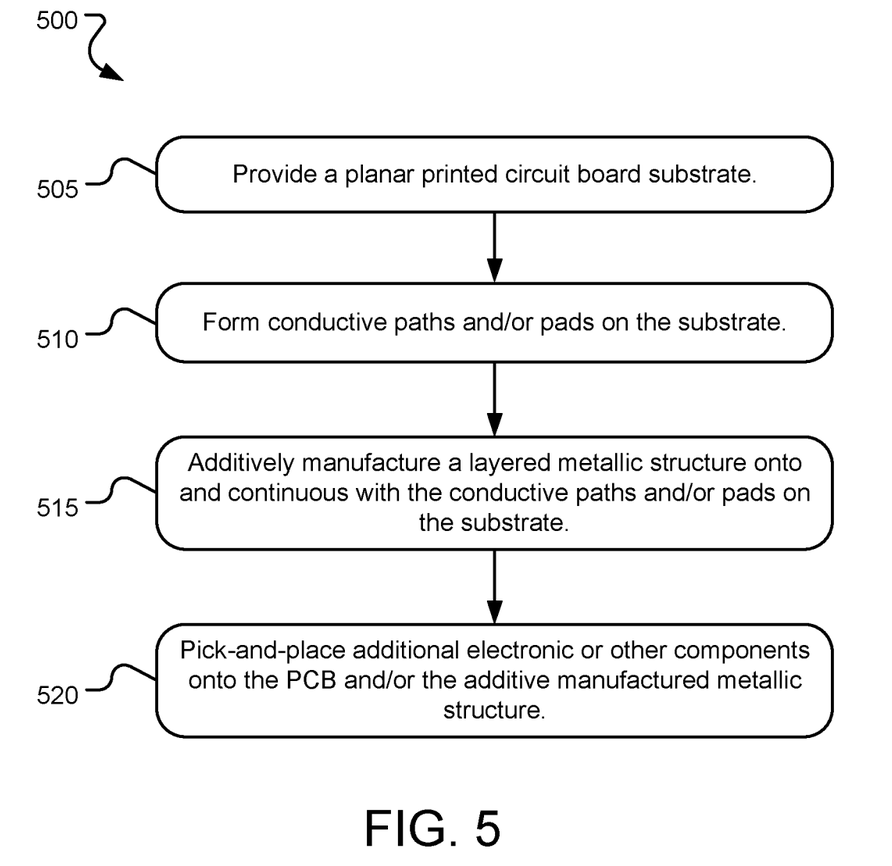
FIG. 5 illustrates example operations for manufacturing a metal additive structure onto a printed circuit board.

FIG. 5 illustrates example operations 500 for manufacturing a metal additive structure onto a printed circuit board. A providing operation 505 provides a planar PCB substrate. In various implementations the PCB substrate includes ceramics, fiberglass, plastics, or any combination thereof. Further, the PCB substrate may be an FR-1 through FR-6 material, a G-10 or G-11 material, a CEM-1 through CEM-5 material, PTFE, PTFE composite, RF-35, aluminum or other metal core board (i.e., insulated metal substrate), alumina, polyimide foil, and polyimide-fluoropolymer composite foil.

A forming operation 510 forms one or more conductive metallic paths and/or pads on the PCB substrate. The forming operation 510 is generally a subtractive, additive, or semi-additive process. In a subtractive process, the PCB substrate starts with one or both planar surfaces entirely coated with metal (e.g., copper). Areas of the metal are removed from the PCB substrate leaving a network of conductive paths and pads remaining. In an additive process, the network of conductive paths and pads is electroplated onto an uncoated PCB substrate. In a semi-additive process, the PCB substrate contains a thin coating of metal on one or both of the planar surfaces of the PCB. A reverse mask is applied to the PCB substrate where additional metal plating is added to unmasked areas of the PCB. The mask is stripped away and any remaining thin areas of copper are stripped away, resulting in the network of conductive paths and pads remaining.

An additive manufacturing operation 515 additively manufactures a series of layers of a metallic structure onto and continuous with the conductive metallic paths and pads on the PCB. Various additive manufacturing processes may be used to build the metallic structure (e.g., powder bed fusion, selective laser melting, direct metal laser sintering, directed energy deposition, electron beam melting, particle jetting, and metal screen printing).

For example, in a powder bed fusion additive manufacturing process, the planar PCB with the network of conductive paths and pads is attached to a fixture within an additive manufacturing machine. A layer of metallic powder is evenly distributed over a PCB surface (e.g., via a powder coating blade). A laser (or electron beam) is aimed at points within the layer of metallic powder defined by a 3D model of the metallic structure that is to be constructed using the metallic powder. The metallic powder is melted and fused together in the precise areas targeted by the laser. Laser power and speed are tuned to achieve sufficient penetration into the PCB conductive paths and pads to create a complete weld between the structures.

After the initial powder layer is fused, the fixture drops down an incremental step and the metallic powder is redistributed across the PCB surface and the laser is again aimed at points within the layer of metallic powder defined by the 3D model of the metallic structure. Subsequent layers of metallic powder are spread and fused together iteratively building the 3-dimensional metallic structure continuous with conductive paths or areas on the PCB and packed within a bed of unfused metal powder. Once the metallic structure is complete, the remaining unfused powder is removed from the PCB (e.g., by shaking it off or blowing it away). In some implementations, the additive manufacturing operation 515 is repeated on an opposite side of the PCB to build additional metallic structure(s) on the opposite side of the PCB.

A pick-and-place operation 520 attaches additional electronic or other components (e.g., resistors, capacitors, integrated circuits, and SOCs) onto the PCB and/or the additive manufactured metallic structure. The additional electronic components or other components may be interference fit, soldered, adhered, and/or mechanically fastened, for example. In an example implementation, the additional electronic or other components are attached using solder paste and a reflow oven within a pick-and-place machine.

Because the additive manufacturing operation 515 results in the surface of the PCB being 3-dimensional, the pick-and-place operation 520 may involve chip bonding using small applicators rather than board-wide applicators. Other options for the pick-and-place operation 520 include pad printing and precision deposition using an automated dispensing machine.

The operations making up the embodiments of the invention described herein are referred to variously as operations, steps, objects, or modules. The operations may be performed in any order, adding or omitting operations as desired, unless explicitly claimed otherwise or a specific order is inherently necessitated by the claim language.

An example printed circuit board includes an insulating substrate with one or more conductive metallic paths thereon. The example printed circuit board also includes a layered metallic structure additively manufactured onto and continuous with the conductive metallic paths and additively extending away from the printed circuit board.

Another example printed circuit board also includes one or more electronic components soldered to the insulating substrate, wherein the layered metallic structure includes a shield can wall around the electronic components.

Another example printed circuit board also includes a shield can lid attached to the shield can wall, wherein the insulating substrate, the shield can wall, and the shield can lid in combination encompass the electronic components.

Another example printed circuit board includes the layered metallic structure, which in turn also includes one or more internal supports within a perimeter of the shield can wall, the internal supports attached to and supporting the shield can lid.

Another example printed circuit board includes the layered metallic structure, which in turn also includes one or more attachment features that provide additional contact area with an adjacent structure.

Another example printed circuit board also includes one or more electronic components offset a predetermined distance from the printed circuit board. The layered metallic structure serves as a frame supporting the electronic components and attaching the printed circuit board to the electronic components.

Another example printed circuit board includes the electronic components, which in turn include a display.

Another example printed circuit board includes the layered metallic structure, which forms an antenna on the printed circuit board.

Another example printed circuit board includes the antenna, which forms a structural component of the printed circuit board.

Another example printed circuit board also includes one or more electronic components soldered to the insulating substrate. The layered metallic structure forms a heat sink that conducts thermal energy from the electronic components.

Another example printed circuit board includes the layered metallic structure, which forms one or more of a pogo pin, a leaf spring, a finger connector, and a compliant gasket.

Another example printed circuit board includes the conductive metallic paths, which in turn include one or more of vias, traces, and pads on the printed circuit board.

Another example printed circuit board includes the conductive metallic paths, which differ in material composition from the layered metallic structure.

An example method of manufacturing a printed circuit board includes forming one or more conductive metallic paths on an insulating substrate. The method also includes additively manufacturing a series of layers of a metallic structure onto and continuous with the conductive metallic paths and additively extending away from the printed circuit board.

Another example method of manufacturing a printed circuit board is operated such that the conductive metallic paths are formed via one or more of subtractive, additive, and semi-additive manufacturing processes.

Another example method of manufacturing a printed circuit board is operated such that the additive manufacturing process includes one or more of selective laser melting, direct metal laser sintering, directed energy deposition, electron beam melting, and metal screen printing.

Another example method of manufacturing a printed circuit board is operated such that the conductive metallic paths include one or more of vias, traces, and pads on the printed circuit board.

Another example method of manufacturing a printed circuit board is operated such that the conductive metallic paths differ in material composition from the layered metallic structure.

An example shielded electronic device includes an insulating substrate with one or more conductive metallic paths traced thereon and one or more electronic components soldered thereon. The example shielded electronic device also includes a layered shield can wall additively manufactured onto and continuous with the conductive metallic paths, the layered shield can wall additively extending away from the insulating substrate. The example shielded electronic device also includes a shield can lid attached to the shield can wall. The insulating substrate, the shield can wall, and the shield can lid in combination encompass the electronic components of the shielded electronic device.

Another example printed circuit board also includes one or more internal supports additively manufactured within a perimeter of the shield can wall. The internal supports are attached to and support the shield can lid.

Another example system includes means for forming one or more conductive metallic paths on an insulating substrate. The example system further includes means for additively manufacturing a series of layers of a metallic structure onto and continuous with the conductive metallic paths and extending away from the printed circuit board.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method of manufacturing a printed circuit board, the method comprising:
    forming one or more conductive metallic paths on an insulating substrate; and
    additively manufacturing a series of multiple layers of a continuous metallic structure onto and continuous with the conductive metallic paths, the multilayered continuous metallic structure additively extending away from the insulating substrate.

2. The method of claim 1, further comprising:
    attaching one or more electronic components to the insulating substrate, wherein the multilayered continuous metallic structure forms a heat sink that conducts thermal energy away from the electronic components.

3. The method of claim 1, further comprising:
    attaching one or more electronic components to the insulating substrate using a pick-and-place process after additively manufacturing the multilayered continuous metallic structure.

4. The method of claim 1, further comprising:
    attaching one or more electronic components offset a predetermined distance from the insulating substrate, wherein the multilayered continuous metallic structure serves as a frame supporting the electronic components and attaching the insulating substrate to the electronic components.

5. The method of claim 1, wherein the multilayered continuous metallic structure forms an antenna on the insulating substrate.

6. The method of claim 1, wherein the multilayered continuous metallic structure forms one or more of a pogo pin, a leaf spring, a finger connector, and a compliant gasket.

7. The method of claim 1, wherein the multilayered continuous metallic structure is fusion welded to the conductive metallic paths.

8. The method of claim 1, wherein the additively manufacturing operation includes:
    distributing a layer of metallic powder over the insulating substrate;
    directing a laser at the layer of metallic powder to melt and fuse the metallic powder together; and iteratively repeating the distributing and the directing operations to create the multilayered continuous metallic structure.

9. The method of claim 1, wherein the additive manufacturing process includes one or more of selective laser melting, direct metal laser sintering, directed energy deposition, electron beam melting, and metal screen printing.

10. The method of claim 1, wherein the conductive metallic paths are formed via one or more of subtractive, additive, and semi-additive manufacturing processes.

11. A method of manufacturing a shielded electronic device, the method comprising:
  forming one or more conductive metallic paths on an insulating substrate; and
  additively manufacturing a multilayered shield can wall onto and continuous with the conductive metallic paths, the shield can wall additively extending away from the insulating substrate.

12. The method of claim 11, further comprising:
  attaching one or more electronic components to the insulating substrate within a perimeter defined by the shield can wall.

13. The method of claim 12, further comprising:
  attaching a shield can lid to the shield can wall, wherein the insulating substrate, the shield can wall, and the shield can lid in combination encompass the electronic components.

14. The method of claim 13, wherein the multilayered shield can wall includes one or more attachment features that provide additional contact area with the shield can lid.

15. The method of claim 13, wherein the shield can wall includes one or more internal supports within the perimeter defined by the shield can wall, the internal supports attached to and supporting the shield can lid.

16. The method of claim 11, wherein the multilayered shield can wall is fusion welded to the conductive metallic paths.

17. The method of claim 11, wherein the additively manufacturing operation includes:
  distributing a layer of metallic powder over the insulating substrate;
  directing a laser at the layer of metallic powder to melt and fuse the metallic powder together; and
  iteratively repeating the distributing and the directing operations to create the multilayered shield can wall.

18. The method of claim 11, wherein the additive manufacturing process includes one or more of selective laser melting, direct metal laser sintering, directed energy deposition, electron beam melting, and metal screen printing.

19. The method of claim 11, wherein the conductive metallic paths are formed via one or more of subtractive, additive, and semi-additive manufacturing processes.

* * * * *